United States Patent
Yamagiwa et al.

(10) Patent No.: US 8,063,418 B2
(45) Date of Patent: Nov. 22, 2011

(54) SEMICONDUCTOR DEVICE

(75) Inventors: Hiroto Yamagiwa, Hyogo (JP); Takashi Saji, Osaka (JP); Saichiro Kaneko, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/886,056

(22) Filed: Sep. 20, 2010

(65) Prior Publication Data

US 2011/0006340 A1 Jan. 13, 2011

Related U.S. Application Data

(62) Division of application No. 12/202,607, filed on Sep. 2, 2008, now abandoned.

(30) Foreign Application Priority Data

Sep. 27, 2007 (JP) ................................. 2007-251232

(51) Int. Cl.
*H01L 29/739* (2006.01)

(52) U.S. Cl. ................. 257/213; 257/141; 257/E29.199

(58) Field of Classification Search .................. 257/213, 257/141, E29.199
See application file for complete search history.

(56) References Cited

U.S. PATENT DOCUMENTS

| | | | |
|---|---|---|---|
| 4,485,393 | A | 11/1984 | Kumamaru et al. |
| 5,530,277 | A | 6/1996 | Otsuki et al. |
| 5,559,347 | A | 9/1996 | Yamazaki et al. |
| 5,635,823 | A | 6/1997 | Murakami et al. |
| 7,759,696 | B2 | 7/2010 | Kaneko et al. |

FOREIGN PATENT DOCUMENTS

| | | |
|---|---|---|
| JP | 07-297387 | 11/1995 |
| JP | 09-260592 | 10/1997 |

*Primary Examiner* — Jarrett Stark
*Assistant Examiner* — Lawrence Tynes, Jr.
(74) *Attorney, Agent, or Firm* — McDermott Will & Emery LLP

(57) ABSTRACT

In a high-voltage semiconductor switching element, in addition to a first emitter region that is necessary for switching operations, a second emitter region, which is electrically connected with the first emitter region through a detection resistor in current detection means and is electrically connected with the current detection means, is formed. No emitter electrode is formed on the second emitter region, while an emitter electrode is formed on a part of a base region that is adjacent to the second emitter region.

16 Claims, 11 Drawing Sheets

SEMICONDUCTOR DEVICE

RELATED APPLICATIONS

This application is a Divisional of U.S. application Ser. No. 12/202,607 filed on Sep. 2, 2008 now abandoned, which claims the benefit of Japanese Patent Application No. JP 2007-251232, filed on Sep. 27, 2007, the disclosures of all of which are incorporated herein by reference.

BACKGROUND OF THE INVENTION

1. Field of the Invention

The present invention relates to a semiconductor device including an insulated gate switching element, and more particularly relates to a semiconductor device including an overcurrent protection circuit to protect a switching element from an overcurrent.

2. Description of the Related Art

FIG. 12 shows a typical cross-sectional configuration of a lateral insulated gate bipolar transistor (hereinafter referred to as an "IGBT") which is used as a high-voltage semiconductor switching element. As shown in FIG. 12, an N-type extended drain region 52 and a P-type base region 53 adjacent to the extended drain region 52 are formed in surface portions of a semiconductor substrate 51. An $N^+$-type emitter region 54 is formed in a surface portion of the base region 53 so as to be spaced apart from the extended drain region 52. A gate insulating film 56 is formed on the base region 53 so as to extend on a part of the emitter region 54 and on a part of the extended drain region 52, and a gate electrode 57 is formed on the gate insulating film 56. A P-type collector region 58 is formed in a surface portion of the extended drain region 52 so as to be spaced apart from the base region 53.

Moreover, the IGBT shown in FIG. 12 includes a collector terminal P1' electrically connected to the collector region 58, a gate terminal P2' electrically connected to the gate electrode 57, and an emitter terminal P3' electrically connected to the emitter region 54.

The lateral IGBT shown in FIG. 12 is turned on when a forward bias voltage is applied between the gate terminal P2' and the emitter terminal P3' with the collector terminal P1' set to a high potential. Conversely, when a zero bias voltage or a reverse bias voltage is applied between the gate terminal P2' and the emitter terminal P3', the lateral IGBT is turned off. In this manner, the lateral IGBT has a switching characteristic in which the lateral IGBT is turned on and off in accordance with the gate voltage applied to the gate electrode 57.

A semiconductor device including such a lateral IGBT is often used with an inductive load connected between the collector terminal P1' and a power supply. If a failure occurs in such a situation, the inductive load is short-circuited, causing a current more than several times a rated current to pass through the lateral IGBT. When the load is thus short-circuited, it is necessary to sense the overcurrent so as to interrupt the gate voltage or the collector voltage, because otherwise there would be a thermal breakdown in the lateral IGBT due to the temperature increase.

In view of this, a semiconductor device having an overcurrent protection function for lateral IGBT shown in FIG. 13 has been proposed (see Patent Document 1). The semiconductor device 10 shown in FIG. 13 includes a lateral IGBT 1, which is a principal switching element controlled by a gate voltage, and a current detection lateral IGBT 2 connected in parallel to the lateral IGBT 1. Respective gate electrodes of the lateral IGBTs are electrically connected to the gate terminal P2', respective collector regions in the lateral IGBTs are electrically connected to the collector terminal P1', and an emitter region in the lateral IGBT 1 as the principal switching element is electrically connected to the emitter terminal P3'. An emitter region in the current detection lateral IGBT 2 is connected with a sense resistor 23 as a current detection resistor. In the semiconductor device 10 shown in FIG. 13, a current detection circuit 20, which is electrically connected with the current detection lateral IGBT 2, includes a voltage comparator 21, a reference voltage circuit 22, and the aforementioned sense resistor 23, both of which are connected with the voltage comparator 21. The respective other ends of the reference voltage circuit 22 and the sense resistor 23 are electrically connected to the emitter terminal P3'.

In the semiconductor device 10 of FIG. 13, a current 9 passing through the current detection lateral IGBT 2 flows through the sense resistor 23 to the emitter terminal P3'. As a result, a voltage generated between both ends of the sense resistor 23 is compared with a voltage generated by the reference voltage circuit 22 by the voltage comparator 21, and a current 8 passing through the lateral IGBT 1 as the principal switching element is controlled based on the thus obtained voltage difference.

[Patent Document 1] Japanese Laid-Open Publication No. 9-260592
[Patent Document 2] Japanese Laid-Open Publication No. 7-297387

SUMMARY OF THE INVENTION

However, the conventional semiconductor device having the overcurrent protection function for the lateral IGBT has a following problem described below.

Specifically, in the semiconductor device 10 of FIG. 13, when the voltage generated between both ends of the sense resistor 23 is increased, the potential of the emitter region in the current detection lateral IGBT 2 is increased, causing the current not to flow well through the lateral IGBT 2 and thus preventing proper operation of the overcurrent protection function. In order to allow the overcurrent protection function, i.e., the current detection circuit 20, to operate properly, the voltage generated between both ends of the sense resistor 23 must be limited to approximately 0.3 V at the most.

In the conventional semiconductor device 10 of FIG. 13, when the ratio between the current 9 passing through the sense resistor 23 and the current 8 passing through the lateral IGBT 1 (i.e., the current 8/the current 9) is designated as a sense ratio, the sense ratio is as small as approximately 200, for example. Therefore, in a case in which the overcurrent protection function should operate when the value of the current 8 reaches 4 A, for example, the value of the current 9 at this time will be 20 mA. Thus, in order to make the voltage between both ends of the sense resistor 23 be 0.3 V or lower, the resistance value of the sense resistor 23 must be set as small as 15Ω or less. Nevertheless, when the sense resistor 23 is formed to have a small resistance value of approximately 15Ω, fabrication variation in the resistance value becomes so large that a current value (i.e., the value of the current 9 passing through the sense resistor 23) at which the overcurrent protection function operates is also varied largely.

On the other hand, in order to increase the sense ratio, the size of the current detection lateral IGBT 2 may be reduced to thereby lower the value of the current 9. In this case, however, the problem of increased variation in the value of the current 9, i.e., in the current value at which the overcurrent protection function operates, caused by the reduction in the size of the lateral IGBT 2, is again unavoidable.

That is, since the sense ratio cannot be sufficiently increased in the conventional semiconductor device having the overcurrent protection function for the lateral IGBT, the resistance value of the sense resistor and the size of the current detection IGBT are unavoidably designed to be small, which results in the problem of increased variation in the current value at which the overcurrent protection function operates.

In view of the foregoing problem, an object of the invention is to provide a semiconductor device which has an overcurrent protection function for a high-voltage semiconductor switching element and in which variation in a current value at which the overcurrent protection operates is reduced by increasing a ratio between a current passing through a sense resistor and a current passing through the high-voltage semiconductor switching element.

In order to achieve the above object, a first inventive semiconductor device includes: a high-voltage semiconductor switching element controlled by a gate voltage applied to a gate electrode; and current detection means including a detection resistor capable of detecting part of current flowing through the high-voltage semiconductor switching element. The high-voltage semiconductor switching element includes: a base region of a second conductivity type formed in a semiconductor substrate of a first conductivity type; a first emitter region of the first conductivity type formed in the base region; a collector region of the second conductivity type formed in the semiconductor substrate so as to be spaced apart from the base region; a gate insulating film formed at least on a part of the base region located closer to the collector region with respect to the first emitter region; a gate electrode formed on the gate insulating film; a collector electrode formed above the semiconductor substrate and electrically connected with the collector region; and an emitter electrode formed above the semiconductor substrate and electrically connected with both the base region and the first emitter region; a second emitter region, which is electrically connected with the first emitter region through the detection resistor and is electrically connected with the current detection means, is also formed in the base region; and the emitter electrode is not formed on the second emitter region, while the emitter electrode is formed on a part of the base region that is adjacent to the second emitter region.

In the invention, the "high-voltage semiconductor switching element" means a switching element which has a breakdown voltage of approximately 200 V or higher, for example, for a drain voltage when a gate voltage is 0 V.

In the first inventive semiconductor device, the second emitter region, which is electrically connected with the current detection means and is electrically connected with the first emitter region through the detection resistor (a sense resistor) in the current detection means, is formed in the high-voltage semiconductor switching element, i.e., in a lateral IGBT, in addition to the emitter region (the first emitter region) that is necessary for switching operations. Also, the emitter electrode is not formed on the second emitter region, while the emitter electrode is formed on a part of the base region that is adjacent to the second emitter region. It is thus possible to prevent a hole current of the current passing through the lateral IGBT from flowing from the second emitter region to the sense resistor. In other words, only an electron current passing through the second emitter region flows to the sense resistor. Hence, the current (a sense current) passing through the sense resistor can be reduced without designing the sense resistor with a small resistance value and the second emitter region of a small size. Thus, in the first inventive semiconductor device having the overcurrent protection function for the high-voltage semiconductor switching element, the ratio between the current flowing from the second emitter region to the sense resistor and the current flowing through the high-voltage semiconductor switching element, that is, a sense ratio, can be made twice as much or higher than that obtained in the conventional semiconductor device. As a result, the resistance value of the sense resistor and the size of the second emitter region can be designed to be larger, so that variations in the current value at which the overcurrent protection operates can be reduced.

In the first inventive semiconductor device, the semiconductor substrate is preferably of the second conductivity type; the semiconductor device preferably further includes a drift region of the first conductivity type formed in the semiconductor substrate so as to be adjacent to the base region; the first emitter region and the second emitter region are preferably spaced apart from the drift region; and the collector region is preferably formed in the drift region.

Then, as compared with a dopant concentration in the semiconductor substrate of the first conductivity type obtained when that semiconductor substrate is used, a dopant concentration in the drift region of the first conductivity type can be increased and hence current capability in the high-voltage semiconductor switching element can be enhanced. Specifically, since the lifetime of minority carriers in the drift region can be shortened by increasing the dopant concentration in the drift region, the fall time of a collector current (i.e., the time required for the collector current to be off when the gate is off) can be reduced.

A second inventive semiconductor device includes: a high-voltage semiconductor switching element controlled by a gate voltage applied to a gate electrode; and current detection means including a detection resistor capable of detecting part of current flowing through the high-voltage semiconductor switching element. The high-voltage semiconductor switching element includes: a base region of a second conductivity type formed in a semiconductor substrate of a first conductivity type; a first emitter/source region of the first conductivity type formed in the base region; a collector region of the second conductivity type formed in the semiconductor substrate so as to be spaced apart from the base region; a drain region of the first conductivity type formed in the semiconductor substrate so as to be spaced apart from the base region; a gate insulating film formed at least on a part of the base region located closer to the collector region with respect to the first emitter/source region; a gate electrode formed on the gate insulating film; a collector/drain electrode formed above the semiconductor substrate and electrically connected with the collector region and the drain region; and an emitter/source electrode formed above the semiconductor substrate and electrically connected with both the base region and the first emitter/source region; a second emitter/source region, which is electrically connected with the first emitter/source region through the detection resistor and is electrically connected with the current detection means, is also formed in the base region; and the emitter/source electrode is not formed on the second emitter/source region, while the emitter/source electrode is formed on a part of the base region that is adjacent to the second emitter/source region.

That is, in the second inventive semiconductor device, when a current flowing through the high-voltage semiconductor switching element is small, the high-voltage semiconductor switching element operates as a MISFET (a metal insulator semiconductor field effect transistor), and when the current flowing through the high-voltage semiconductor switching element is large, the high-voltage semiconductor switching element operates as an IGBT. In the high-voltage semiconductor switching element, the second emitter/source region, which is electrically connected with the current detection means and is electrically connected with the first emitter/source region through the detection resistor (a sense resistor) in the current detection means, is formed in addition to the emitter/source region (the first emitter/source region) that is necessary for the switching operations. Also, the emitter/source electrode is not formed on the second emitter/source region, while the emitter/source electrode is formed on a part of the base region that is adjacent to the second emitter/source region. It is thus possible to prevent a hole current of the current passing through the high-voltage semiconductor switching element from flowing from the second emitter/source region to the sense resistor when the high-voltage semiconductor switching element performs the IGBT operation. In other words, only an electron current passing through the second emitter/source region flows to the sense resistor. Hence, the current (a sense current) passing through the sense resistor can be reduced without designing the sense resistor with a small resistance value and the second emitter/source region of a small size. Thus, in the second inventive semiconductor device having the overcurrent protection function for the high-voltage semiconductor switching element, when the high-voltage semiconductor switching element performs the IGBT operation, the ratio between the current flowing from the second emitter/source region to the sense resistor and the current flowing through the high-voltage semiconductor switching element, that is, a sense ratio, can be made twice as much or higher than that obtained when the high-voltage semiconductor switching element performs the MISFET operation or that obtained in the conventional semiconductor device. As a result, the resistance value of the sense resistor and the size of the second emitter/source region can be designed to be larger, so that variations in the current value at which the overcurrent protection operates can be reduced.

In the second inventive semiconductor device, the semiconductor substrate is preferably of the second conductivity type; the semiconductor device preferably further includes a drift region of the first conductivity type formed in the semiconductor substrate so as to be adjacent to the base region; the first emitter/source region and the second emitter/source region are preferably spaced apart from the drift region; and the collector region and the drain region are preferably formed in the drift region.

Then, as compared with a dopant concentration in the semiconductor substrate of the first conductivity type obtained when that semiconductor substrate is used, a dopant concentration in the drift region of the first conductivity type can be increased, and hence current capability in the high-voltage semiconductor switching element can be enhanced. Specifically, since the lifetime of minority carriers in the drift region can be shortened by increasing the dopant concentration in the drift region, the fall time of a collector current (i.e., the time required for the collector current to be off when the gate is off) can be reduced. In addition, the ON resistance during the MISFET operation can be reduced by increasing the dopant concentration in the drift region, thereby permitting a greater collector current to flow during the MISFET operation as compared with the case in which the semiconductor substrate of the first conductivity type is used.

In the second inventive semiconductor device, the collector region and the drain region each preferably include a plurality of separate parts; and each part of the collector region and each part of the drain region are preferably located alternately so as to be in contact with each other in a direction perpendicular to a direction going from the collector region to the first emitter/source region.

In this way, in the high-voltage semiconductor switching element, by placing each part of the drain region of the first conductivity type perpendicularly to the direction going from the collector region of the second conductivity type to the first emitter/source region of the first conductivity type, the length, i.e., the cell pitch, of each part of the collector region that is necessary for the high-voltage semiconductor switching element to switch from the MISFET operation to the IGBT operation can be reduced as compared with a case in which each part of the drain region is located in parallel to the direction going from the collector region to the first emitter/source region.

Also, in this case, by changing the location of the second emitter/source region in the high-voltage semiconductor switching element in accordance with the location of the drain region of the first conductivity type and the location of the collector region of the second conductivity type, the ratio between the current that flows from the second emitter/source region to the detection resistor and the current that flows through the high-voltage semiconductor switching element when the high-voltage semiconductor switching element performs the IGBT operation can be changed at will without changing the size of the second emitter/source region.

Specifically, if the second emitter/source region and the collector region are located so as to face each other with a part of the base region interposed therebetween, it is possible to reduce a difference between the ratio between the current that flows from the second emitter/source region to the detection resistor and the current that flows through the high-voltage semiconductor switching element when the high-voltage semiconductor switching element performs the MISFET operation and the ratio between the current that flows from the second emitter/source region to the detection resistor and the current that flows through the high-voltage semiconductor switching element when the high-voltage semiconductor switching element performs the IGBT operation as compared with a case in which the second emitter/source region and the drain region are located so as to face each other with a part of the base region interposed therebetween. Hence, a control circuit that deals with sense ratio variations can be configured easily, and thus when overcurrent protection is performed based on the current passing through the second emitter/source region, the current passing through the high-voltage semiconductor switching element is controlled more precisely.

Furthermore, if the second emitter/source region and the drain region are located so as to face each other with a part of the base region interposed therebetween, it is possible to increase the difference between the ratio between the current that flows from the second emitter/source region to the detection resistor and the current that flows through the high-voltage semiconductor switching element when the high-voltage semiconductor switching element performs the MISFET operation and the ratio between the current that flows from the second emitter/source region to the detection resistor and the current that flows through the high-voltage semiconductor switching element when the high-voltage semiconductor switching element performs the IGBT operation as compared with the case in which the second emitter/source region and the collector region are located so as to face each other with a part of the base region interposed therebetween. That is, since the sense ratio can be increased further, the resistance value of the sense resistor and the size of the second emitter/source region can be designed to be larger, so that variations in the current value at which the overcurrent protection operates can be reduced.

As set forth above, the invention relates to a semiconductor device including an insulated gate switching element. More particularly, when applied to a semiconductor device that includes an overcurrent protection circuit to protect a switching element from an overcurrent, the invention produces an excellent effect, in which variations in a current value at which the overcurrent protection operates are reduced by increasing the ratio between a current flowing through a sense resistor and a current flowing through the high-voltage semiconductor switching element, and is thus very beneficial.

DETAILED DESCRIPTION OF THE INVENTION

First Embodiment

A semiconductor device, specifically, a semiconductor device having a high-voltage semiconductor switching element and an overcurrent protection function for the element, according to a first embodiment of the invention will be described with reference to the accompanying drawings.

Figure 1:
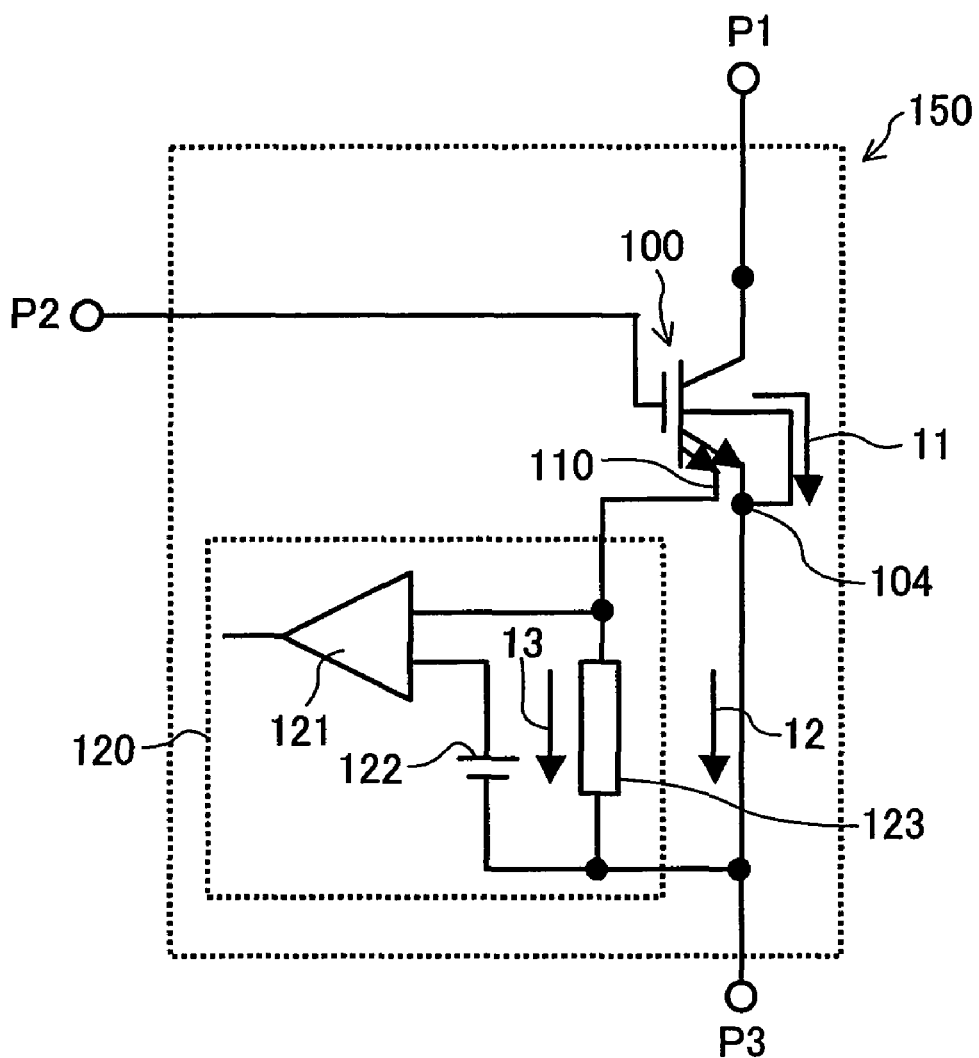
FIG. 1 is a circuit diagram illustrating the configuration of a semiconductor device according to first, second, and third embodiments of the invention.

FIG. 1 shows the rough circuit configuration of the semiconductor device of this embodiment. As shown in FIG. 1, the semiconductor device 150 of this embodiment includes a high-voltage semiconductor switching element 100 composed of a lateral IGBT controlled by a gate voltage applied to a gate electrode. A collector region in the high-voltage semiconductor switching element 100 is electrically connected to a collector terminal (a collector electrode) P1, while a gate electrode of the high-voltage semiconductor switching element 100 is electrically connected with a gate terminal P2. As a characteristic of the semiconductor device of this embodiment, a part (hereinafter referred to as a "second emitter region 110") of an emitter region in the high-voltage semiconductor switching element 100 is connected with a sense resistor 123 acting as a current detection resistor, and the other part (hereinafter referred to as a "first emitter region 104") of the emitter region is electrically connected with an emitter terminal (an emitter electrode) P3. In the semiconductor device of this embodiment, a current detection circuit 120, which is electrically connected with the second emitter region 110, includes a voltage comparator 121, a reference voltage circuit 122, and the aforementioned sense resistor 123, both of which are connected to the voltage comparator 121. The other terminals of the reference voltage circuit 122 and the sense resistor 123 are electrically connected to the emitter terminal P3. In other words, the second emitter region 110 and the first emitter region 104 are electrically connected with each other through the sense resistor 123.

Figure 2:
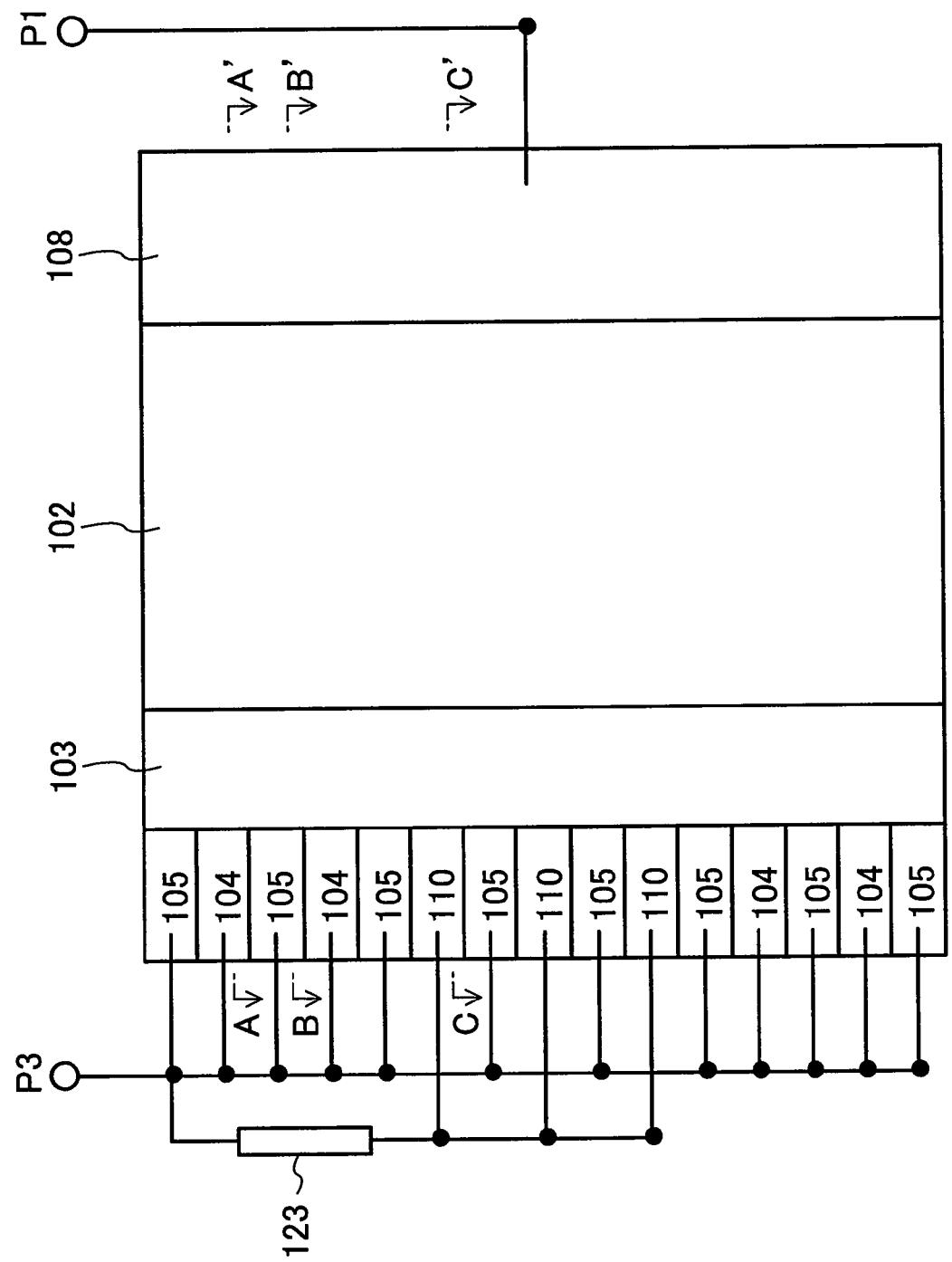
FIG. 2 is a plan view illustrating the configuration of the semiconductor device according to the first embodiment of the invention.
Figure 3:
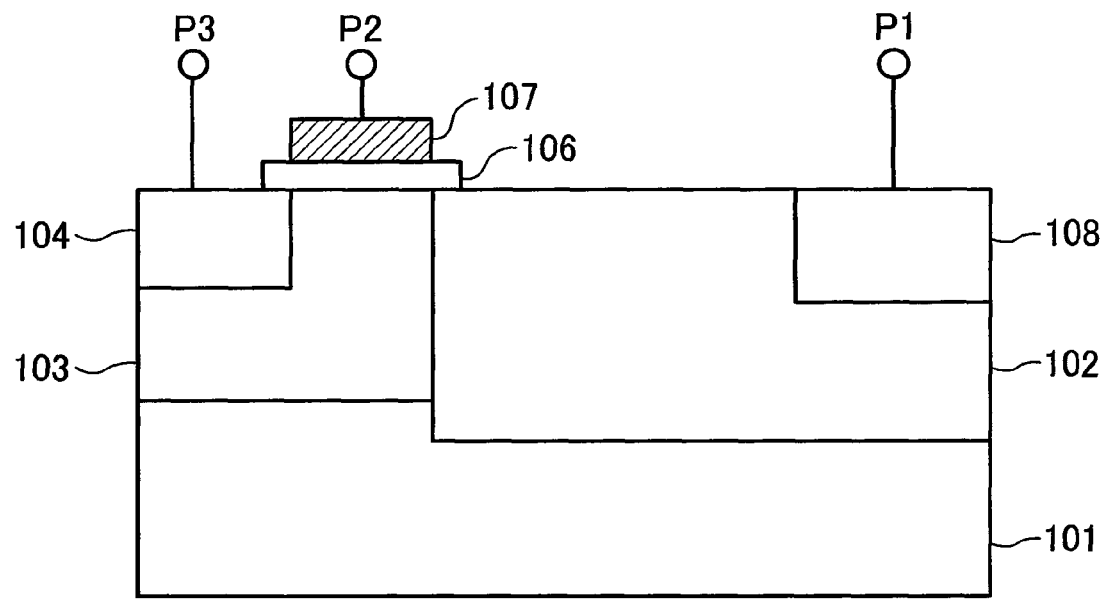
FIG. 3 is a cross-sectional view taken along the line A-A' in FIG. 2.
Figure 4:
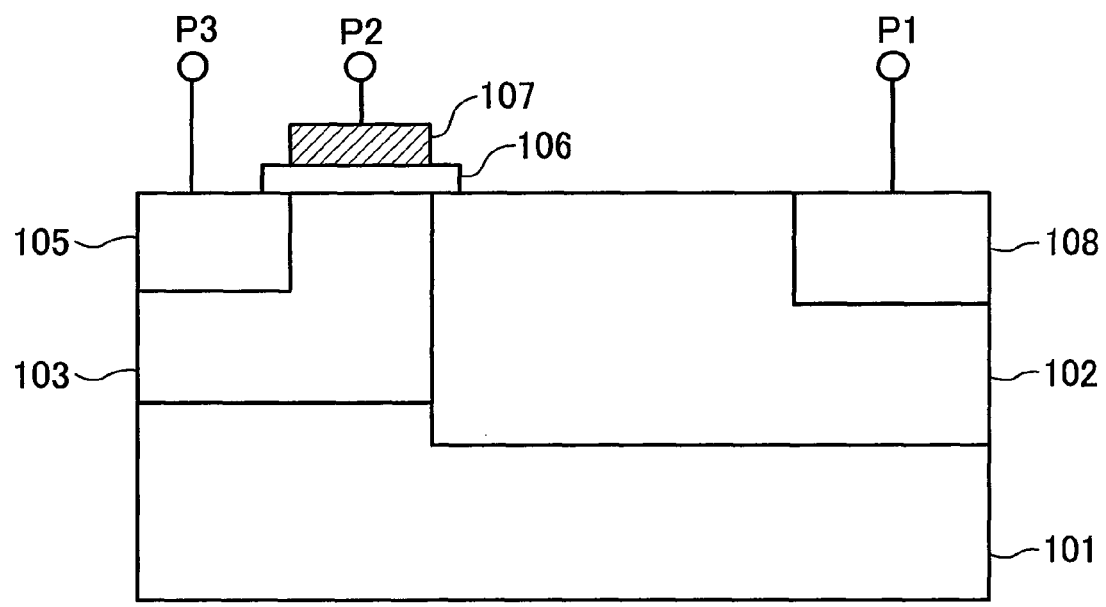
FIG. 4 is a cross-sectional view taken along the line B-B' in FIG. 2.
Figure 5:
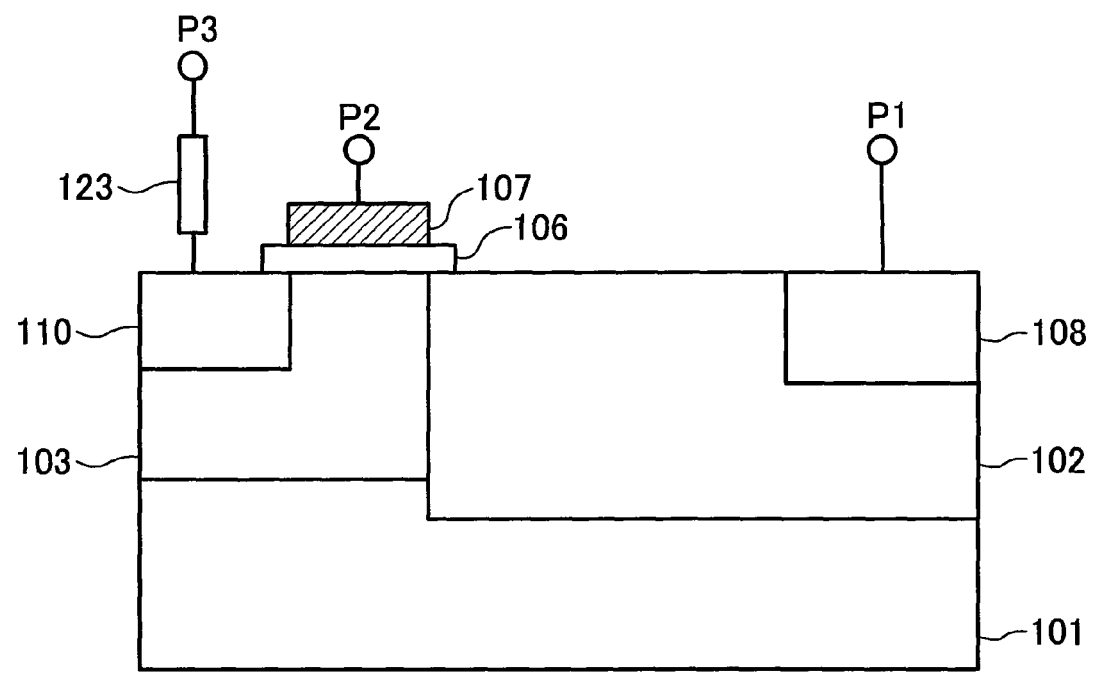
FIG. 5 is a cross-sectional view taken along the line C-C' in FIG. 2.

FIG. 2 is a plan view of the high-voltage semiconductor switching element 100 in the semiconductor device 150 of this embodiment illustrated in FIG. 1, and FIGS. 3 to 5 are cross-sectional views taken along the lines A-A', B-B', and C-C' in FIG. 2, respectively.

The high-voltage semiconductor switching element 100 shown in FIGS. 2 to 5, i.e., a lateral IGBT according to this embodiment, is configured in the following manner. An N-type extended drain region (a drift region) 102 having a dopant concentration of approximately $1 \times 10^{16}/cm^3$, for example, and a P-type base region 103 having a dopant concentration of approximately $1 \times 10^{17}/cm^3$, for example, which is adjacent to the extended drain region 102, are formed in surface portions of a P⁻-type semiconductor substrate 101 having a dopant concentration of approximately $1 \times 10^{14}/cm^3$, for example. An N⁺-type first emitter region 104 having a dopant concentration of approximately $1 \times 10^{20}/cm^3$, for example, is formed in surface portions of the base region 103 so as to be spaced apart from the extended drain region 102. Also, a P⁺-type base contact region 105 having a dopant concentration of approximately $1 \times 10^{19}/cm^3$, for example, is formed in surface portions of the base region 103 so as to be in contact with the first emitter region 104, and the base region 103 and the first emitter region 104 are electrically connected with each other through the base contact region 105. A gate insulating film 106 is formed on the base region 103 so as to extend on part of the first emitter region 104 and on a part of the extended drain region 102, and a gate electrode 107 is formed on the gate insulating film 106. A P⁺-type collector region 108 having a dopant concentration of approximately $1 \times 10^{19}/cm^3$, for example, is formed in a surface portion of the extended drain region 102 so as to be spaced apart from the base region 103.

In this embodiment, the first emitter region 104 and the base contact region 105 are composed of separate parts, and each part of the first emitter region 104 and each part of the base contact region 105 are located alternately so as to be in contact with each other in a direction perpendicular to a direction going from the base region 103 to the collector region 108. As a characteristic of this embodiment, as stated above, parts of the first emitter region 104 are replaced with the second emitter region 110, and the second emitter region 110 is connected with the first emitter region 104 through the sense resistor 123 having a resistance of approximately 70Ω, for example. Also, an emitter electrode is formed on the first emitter region 104 and on the base contact region 105 (including parts adjacent to the second emitter region 110), while the emitter electrode is not formed on the second emitter region 110.

It should be noted that in the semiconductor device 150 of this embodiment shown in FIGS. 1 to 5, part of the base contact region 105 adjacent to the second emitter region 110 and part of the base contact region 105 adjacent to the first emitter region 104 are all connected with the first emitter region 104 through the emitter electrode (the emitter terminal P3). The sense resistor 123 is connected between the first emitter region 104 and the second emitter region 110. In other words, the sense resistor 123 is connected between the second emitter region 110 and the first emitter and base contact region 104 and 105, the base contact region 105 being electrically connected with the first emitter region 104 through the emitter electrode. Since the base region 103 is electrically connected with the first emitter region 104 through the base contact region 105 and the emitter electrode, the potential of the base region 103 is the same as that of the first emitter region 104.

Due to this characteristic, of the current passing through the high-voltage semiconductor switching element 100, an entire hole current flows as a current 11 (see FIG. 1) from the base region 103 through the base contact region 105 to the emitter terminal P3. That is, it is possible to prevent the hole current of the current passing through the high-voltage semiconductor switching element 100 from flowing from the second emitter region 110 to the sense resistor 123. On the other hand, only an electron current passing through the second emitter region 110 flows as a sense current 13 to the emitter terminal P3 through the sense resistor 123. And a voltage generated between both ends of the sense resistor 123 is compared with a voltage generated by the reference voltage circuit 122 by the voltage comparator 121, and a current (i.e., a current 12 in FIG. 1) passing through the high-voltage semiconductor switching element 100 as the principal switching element is controlled based on the thus obtained voltage difference.

As described above, in the semiconductor device 150 of this embodiment unlike in the conventional example, since the hole current 11 passing through the high-voltage semiconductor switching element 100 does not flow through the sense resistor 123, the sense current 13 is reduced by an amount corresponding to the hole current 11. That is, when the ratio between the sense current 13 passing through the sense resistor 123 and the current 12 passing through the high-voltage semiconductor switching element 100 is designated as a sense ratio, the sense ratio can be increased in the semiconductor device 150 of this embodiment as compared with the conventional example.

The results of an experiment actually made by the present inventors show that under conditions in which the conventional semiconductor device would have a sense ratio of approximately 300, when a base region in a current detection IGBT (i.e., parts of the base region 103 adjacent to the second emitter region 110) was electrically connected with an emitter region (i.e., the first emitter region 104) in an IGBT serving as a principal switching element as in this embodiment, a sense ratio was substantially doubled to approximately 600.

Thus, in the semiconductor device 150 having the overcurrent protection function for the high-voltage semiconductor switching element according to this embodiment, since the sense ratio can be increased as compared with the conventional semiconductor device, the resistance value of the sense resistor 123 and the size of the second emitter region 110 can be designed to be larger, so that variations in the current value at which the overcurrent protection operates can be reduced.

In this embodiment, the N-type extended drain region (the drift region) 102 is formed, and the P-type collector region 108 is formed in the N-type extended drain region 102. Instead of this formation, a P-type collector region may be formed in an N-type semiconductor substrate without forming the extended drain region 102. However, in the case in which the N-type extended drain region 102 is formed, a dopant concentration can be increased and hence current capability in the high-voltage semiconductor switching element can be enhanced as compared with cases in which an N-type semiconductor substrate is used. Specifically, since the lifetime of minority carriers in the extended drain region 102, i.e., in the drift region, can be shortened by increasing the dopant concentration in the drift region, the fall time of a collector current (i.e., the time required for the collector current to be off when the gate is off) can be reduced.

Also, in this embodiment, the gate insulating film 106 is formed on the base region 103 so as to extend on part of the first emitter region 104 and on a part of the extended drain region 102. However, it would be sufficient if the gate insulating film 106 is formed at least on a part of the base region 103 located closer to the collector region 108 with respect to the first emitter region 104.

Comparison Example

A semiconductor device as a comparison example (see Patent Document 2) will be described with reference to the accompanying drawings.

Figure 12:
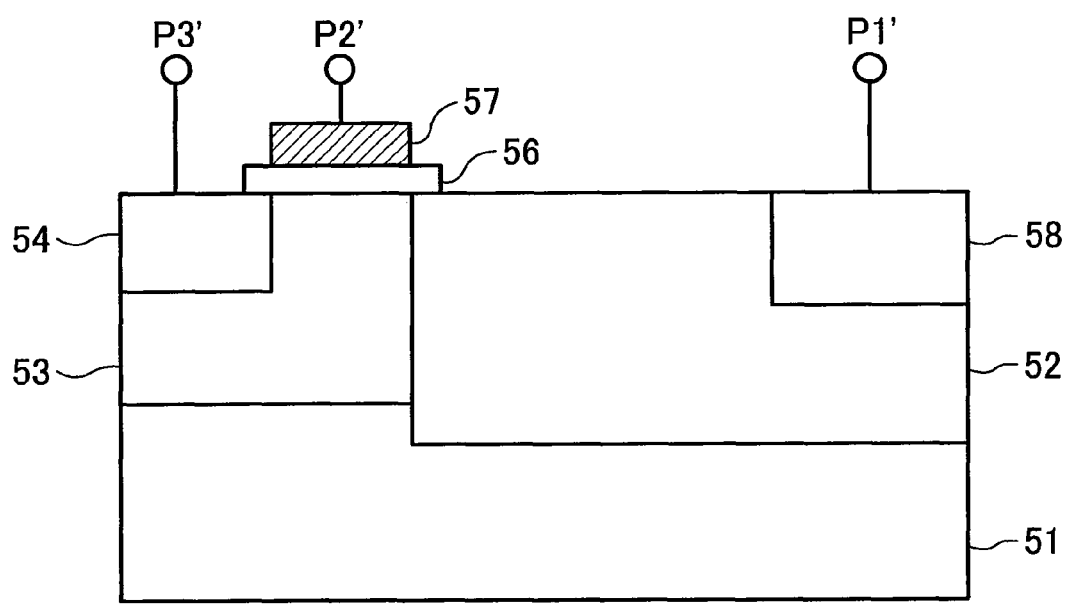
FIG. 12 is a cross-sectional view of a conventional lateral IGBT.
Figure 13:
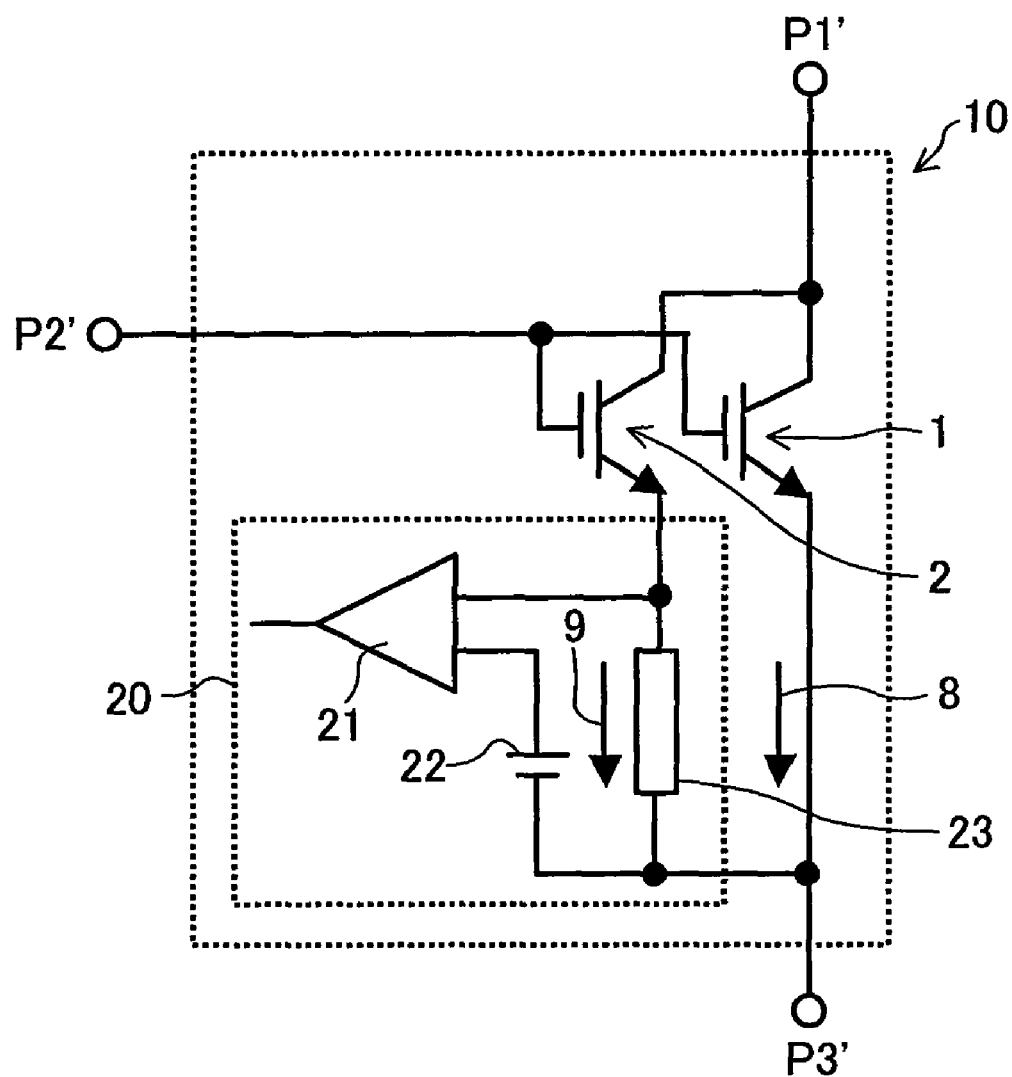
FIG. 13 is a circuit diagram of a conventional semiconductor device having an overcurrent protection function for a lateral IGBT.
Figure 14:
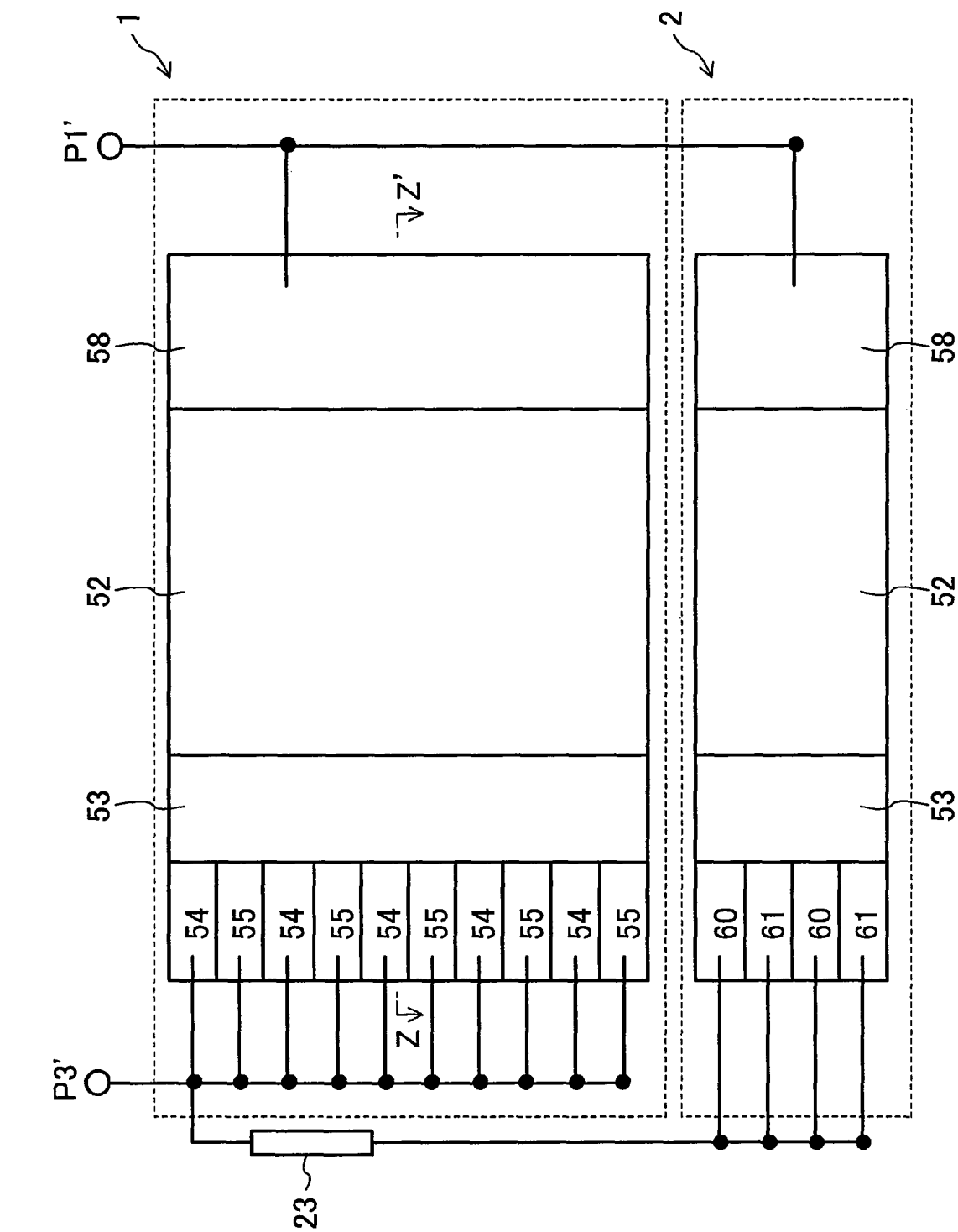
FIG. 14 is a plan view illustrating the configuration of a semiconductor device as a comparison example.

FIG. 14 is a plan view of the semiconductor device as the comparison example, specifically, the lateral IGBT 1 as the principal switching element and the current detection lateral IGBT 2 in the conventional semiconductor device shown in FIG. 13. A cross-sectional view taken along the line Z-Z' in FIG. 14 corresponds to FIG. 12 (a cross-sectional configuration of the conventional lateral IGBT). In FIG. 14, the same members as those shown in FIG. 12 or 13 are identified by the same reference numerals, and duplicated descriptions will be thus omitted herein.

As is shown in FIG. 14, in the lateral IGBT 1 as the principal switching element in the semiconductor device as the comparison example, a base contact region 55 is formed in a surface portion of the base region 53 so as to be in contact with emitter region 54, and the base region 53 and the emitter region 54 are electrically connected with each other through the base contact region 55. The emitter region 54 and the base contact region 55 are composed of separate parts, and each part of the emitter region 54 and each part of the base contact region 55 are located alternately so as to be in contact with each other in a direction perpendicular to a direction going from the base region 53 to the collector region 58.

In the comparison example, parts of the emitter region 54 are replaced with an emitter region 60 for the lateral IGBT 2, and parts of the base contact region 55 are replaced with a base contact region 61 for the lateral IGBT 2. That is, the configuration of the current detection lateral IGBT 2 is the same as that of the lateral IGBT 1 as the principal switching element, but the size of the lateral IGBT 2 is smaller than that of the lateral IGBT 1.

Furthermore, in the comparison example, the emitter region 60 and the base contact region 61 are both connected with the emitter region 54 and the base contact region 55 in the lateral IGBT 1 through the sense resistor 23.

As described above, in the comparison example unlike in the first embodiment, the emitter electrode is not formed on the emitter region 60 for the lateral IGBT 2 nor on the base contact region 61. In other words, the emitter electrode is formed only on the emitter region 54 for the lateral IGBT 1 and on the base contact region 55. As a result, of the current passing through the lateral IGBT 2, a hole current together with an electron current passing through second emitter region 110 also flows through the sense resistor 23 to the emitter terminal P3' as the sense current 9 (see FIG. 13). Therefore, unlike in the first embodiment, the sense current 9 cannot be reduced and hence the sense ratio cannot be increased. Consequently, the resistance value of the sense resistor 23 and the size of the current detection lateral IGBT 2 are unavoidably designed to be small, resulting in the problem of increased variation in the current value at which the overcurrent protection function operates.

Second Embodiment

A semiconductor device, specifically, a semiconductor device having a high-voltage semiconductor switching element and an overcurrent protection function for the element, according to a second embodiment of the invention will be described with reference to the accompanying drawings. The rough circuit configuration of the semiconductor device of this embodiment is the same as that of the first embodiment shown in FIG. 1, and duplicated descriptions will be thus omitted herein. However, in this embodiment, the first emitter region 104 should be read as a first emitter/source region 104, the second emitter region 110 as a second emitter/source region 110, the collector terminal P1 as a collector/drain terminal (a collector/drain electrode) P1, and the emitter terminal P3 as an emitter/source terminal (an emitter/source electrode) P3.

Figure 6:
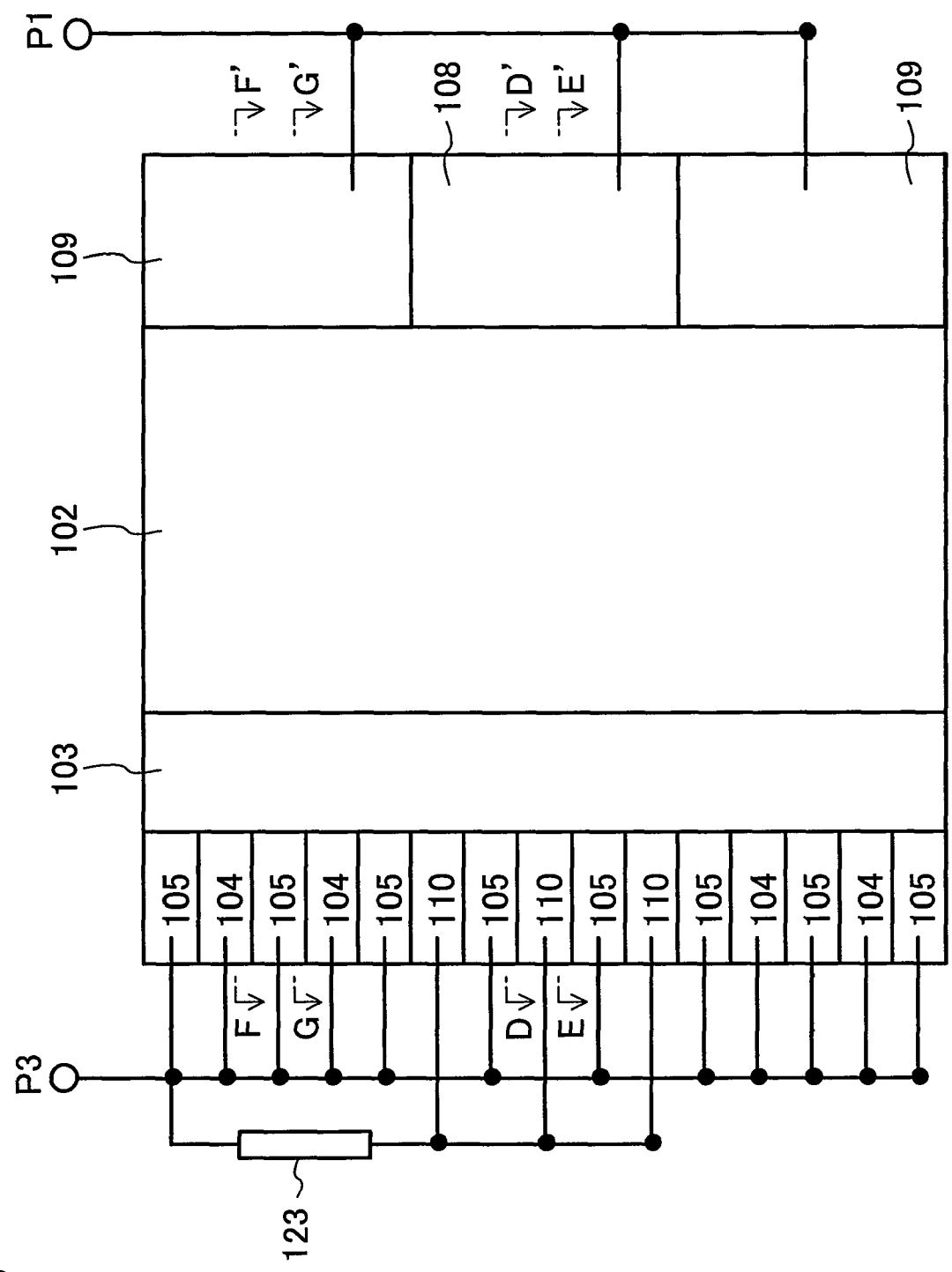
FIG. 6 is a plan view illustrating the configuration of the semiconductor device according to the second embodiment of the invention.
Figure 7:
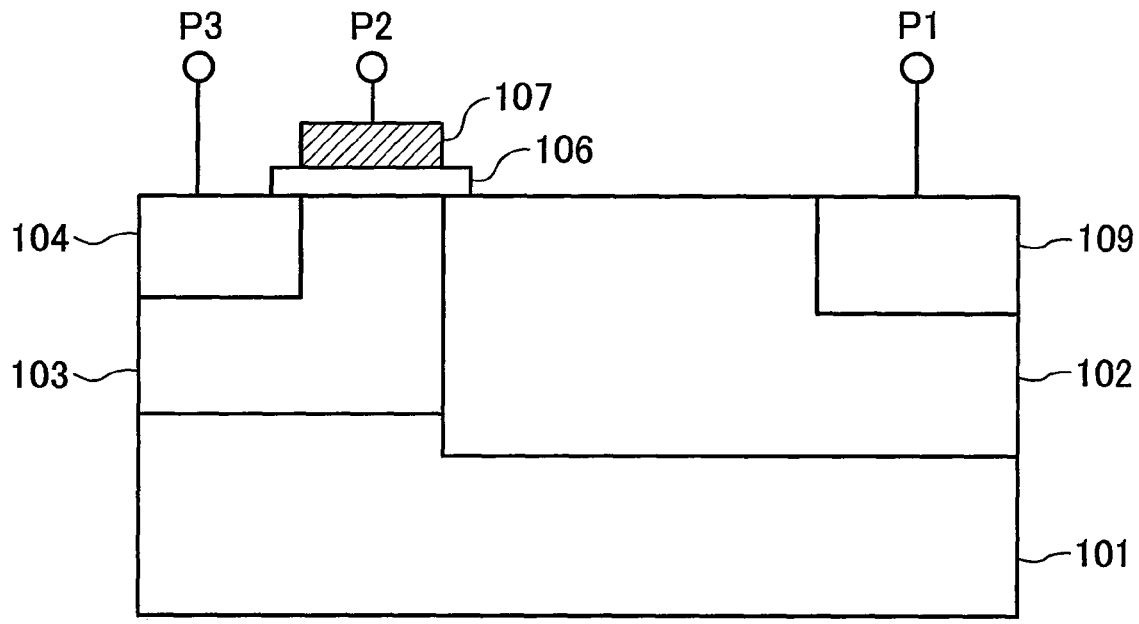
FIG. 7 is a cross-sectional view taken along the line F-F' in FIG. 6.
Figure 8:
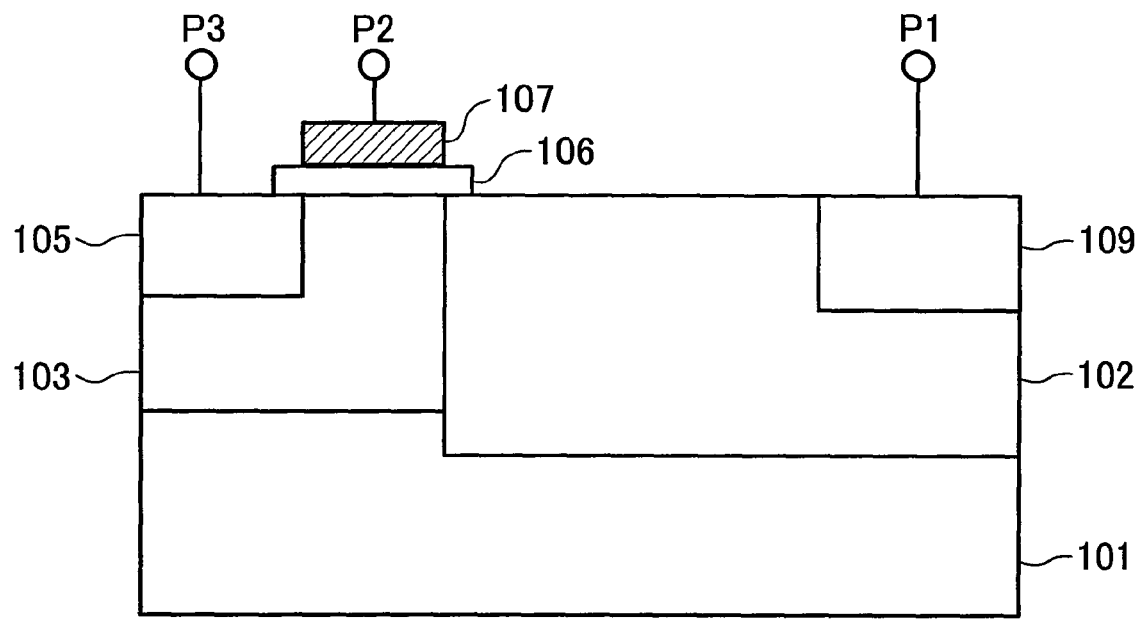
FIG. 8 is a cross-sectional view taken along the line G-G' in FIG. 6.

FIG. 6 is a plan view of the high-voltage semiconductor switching element 100 in the semiconductor device 150 of FIG. 1 according to this embodiment, and FIGS. 7 and 8 are cross-sectional views taken along the lines F-F' and G-G' in FIG. 6, respectively. A cross-sectional view taken along the line D-D' in FIG. 6 is the same as the cross sectional view in the first embodiment shown in FIG. 4, and a cross-sectional view taken along the line E-E' in FIG. 6 is the same as the cross sectional view in the first embodiment shown in FIG. 5. The semiconductor device 150 of this embodiment has the same configuration as the semiconductor device of the first embodiment except for the configuration of the high-voltage semiconductor switching element 100. Thus, in FIGS. 6 to 8, the same members as those of the first embodiment shown in FIGS. 2 to 5 are identified by the same reference numerals, and duplicated descriptions will be omitted herein.

The high-voltage semiconductor switching element 100 of this embodiment shown in FIGS. 6 to 8 differs from that of the first embodiment in the following respects: an N$^+$-type drain region 109 having a dopant concentration of approximately $1\times10^{20}/cm^3$, for example, is formed in a surface portion of an extended drain region 102 so as to be spaced apart from a base region 103. Also, a collector region 108 and the drain region 109 are composed of separate parts, and each part of the collector region 108 and each part of the drain region 109 are located alternately so as to be in contact with each other in a direction perpendicular to a direction going from the collector region 108 to a first emitter/source region 104. The collector region 108 and the drain region 109 are electrically connected with a collector/drain terminal P1.

In the high-voltage semiconductor switching element 100 according to this embodiment, when a positive bias (hereinafter referred to as a "collector voltage") is applied between the collector/drain terminal P1 and an emitter/source terminal P3, current starts to flow from the N$^+$-type drain region 109 through the N-type extended drain region 102 and the P-type base region 103 to the first emitter/source region 104 and to second emitter/source region 110 (hereinafter the current that flows to the first emitter/source region 104 will be called a collector current 12, and the current that flows to the second emitter/source region 110 will be called a sense current 13 (see FIG. 1)). At this time, only electrons flow through the high-voltage semiconductor switching element 100, which means that the high-voltage semiconductor switching element 100 performs a MISFET operation. Next, as the collector voltage is increased, the collector current 12 and the sense current 13 are increased to some extent. And when the potential difference between the P$^+$-type collector region 108 and part of the N-type extended drain region 102 located in the vicinity of the collector region 108 is lowered to approximately 0.6 V, for example, holes are introduced into the extended drain region 102 from the collector region 108, causing the operation of the high-voltage semiconductor switching element 100 to be switched to an IGBT operation.

When the high-voltage semiconductor switching element 100 performs the MISFET operation, current flows from the N$^+$-type drain region 109 completely due to electrons, and all of the current flows to the first emitter/source region 104 and to the second emitter/source region 110. Thus, the sense ratio is determined by the sizes of the first emitter/source region 104 and of the second emitter/source region 110.

On the other hand, when the high-voltage semiconductor switching element 100 performs the IGBT operation, part of the holes introduced from the P$^+$-type collector region 108 into the N-type extended drain region 102 flows from the P-type base region 103 through P$^+$-type base contact region 105 to the emitter/source terminal P3 as a hole current 11 (see FIG. 1). That is, as in the first embodiment, it is possible to prevent the hole current of the current passing through the high-voltage semiconductor switching element 100 from flowing from the second emitter/source region 110 into a sense resistor 123. This allows the sense ratio obtained when the IGBT operation is performed to be increased as compared with that obtained when the MISFET operation is performed.

As set forth above, in the high-voltage semiconductor switching element 100 in the semiconductor device 150 according to this embodiment, the second emitter/source region 110, which are electrically connected with a current detection means 120 and electrically connected with the first emitter/source region 104 through the sense resistor 123 in the current detection means 120, is formed in addition to the first emitter/source region 104 that are necessary for the switching operation. Also, the emitter/source electrode is not formed on the second emitter/source region 110, while the emitter/source electrode is formed on parts of the base region 103 (i.e., the base contact region 105) adjacent to the second emitter/source region 110. Therefore, when the high-voltage semiconductor switching element 100 performs the IGBT operation, it is possible to prevent the hole current 11 of the current passing through the high-voltage semiconductor switching element 100 from flowing from the second emitter/source region 110 to the sense resistor 123. That is, both when the MISFET operation is performed and when the IGBT operation is performed, only the electron current passing through the second emitter/source region 110 flows through the sense resistor 123 to the emitter/source terminal P3 as the sense current 13. And a voltage generated between both ends of the sense resistor 123 is compared with a voltage generated by a reference voltage circuit 122 by a voltage comparator 121, and the current (namely the current 12 in FIG. 1) passing through the high-voltage semiconductor switching element 100 as the principal switching element is controlled based on the thus obtained voltage difference.

Hence, the current (the sense current 13) passing through the sense resistor 123 can be reduced without designing the sense resistor 123 with a small resistance value and the second emitter/source region 110 of a small size. Thus, in the semiconductor device 150 having the overcurrent protection function for the high-voltage semiconductor switching element 100 according to this embodiment, when the high-voltage semiconductor switching element 100 performs the IGBT operation, the ratio between the current 13 flowing from the second emitter/source region 110 to the sense resistor 123 and the current 12 flowing through the high-voltage semiconductor switching element 100, that is, a sense ratio, can be made twice as much or higher than that obtained when the high-voltage semiconductor switching element 100 performs the MISFET operation or that obtained in the conventional semiconductor device. As a result, the resistance value of the sense resistor 123 and the size of the second emitter/source region 110 can be designed to be larger, so that variations in the current value at which the overcurrent protection operates can be reduced.

Furthermore, in this embodiment, the collector region 108 and the drain region 109 are composed of separate parts, and each part of the collector region 108 and each part of the drain region 109 are located alternately so as to be in contact with each other in the direction perpendicular to the direction going from the collector region 108 to the first emitter/source region 104. It is thus possible to reduce the length, i.e., the cell pitch, of each part of the collector region 108 that is necessary for the high-voltage semiconductor switching element 100 to switch from the MISFET operation to the IGBT operation as compared with a case in which each part of the drain region 109 is located in parallel to the direction going from the collector region 108 to the first emitter/source region 104.

In this embodiment, by changing the location of the second emitter/source region 110 in the high-voltage semiconductor switching element 100 in accordance with the locations of the drain region 109 and of the collector region 108, the ratio between the current 13 that flows from the second emitter/source region 110 to the detection resistor 123 and the current 12 that flows through the high-voltage semiconductor switching element 100 when the high-voltage semiconductor switching element 100 performs the IGBT operation can be changed at will without changing the size of the second emitter/source region 110. The reasons for this are as follows. The amount of electrons emitted from the $N^+$-type emitter/source region 104 or 110 that faces the $P^+$-type collector region 108 with the base region 103 interposed therebetween is greater than the amount of electrons emitted from the $N^+$-type emitter/source region 104 or 110 that faces the $N^+$-type drain region 109 with the base region 103 interposed therebetween. Specifically, of the electrons emitted from the $N^+$-type emitter/source region 104 or 110, some electrons flow to the $N^+$-type drain region 109 due to the MISFET operation, and the other electrons recombine with holes introduced from the $P^+$-type collector region 108 into the N-type extended drain region 102. On the other hand, more holes are present in parts of the N-type extended drain region 102 located close to the $P^+$-type collector region 108 as compared with parts of the N-type extended drain region 102 located close to the $N^+$-type drain region 109. Thus, the $N^+$-type emitter/source region 104 or 110 facing the $P^+$-type collector region 108 emits more electrons than the $N^+$-type emitter/source region 104 or 110 facing the $N^+$-type drain region 109. Since the sense current is determined by the amount of electrons emitted from the second emitter/source region 110, the value of the sense current (the current 13) is adjustable by the location of the $N^+$-type second emitter/source region 110 with respect to the locations of the drain region 109 and of the collector region 108. Hence, the ratio between the current 13 that flows from the second emitter/source region 110 to the detection resistor 123 and the current 12 that flows through the high-voltage semiconductor switching element 100 when the high-voltage semiconductor switching element 100 performs the IGBT operation can be changed at will without changing the size of the second emitter/source region 110.

To be specific, in this embodiment, as shown in FIG. 6, the $N^+$-type second emitter/source region 110 faces the $P^+$-type collector region 108 with the P-type base region 103 and the N-type extended drain 102 interposed therebetween. In this case, the current (the sense current 13) flowing through the second emitter/source region 110 is increased as compared with a case in which the second emitter/source region 110 faces the $N^+$-type drain region 109 with the base region 103 and the extended drain 102 interposed therebetween. It is thus possible to lower the sense ratio obtained when the high-voltage semiconductor switching element 100 performs the IGBT operation.

Figure 9:
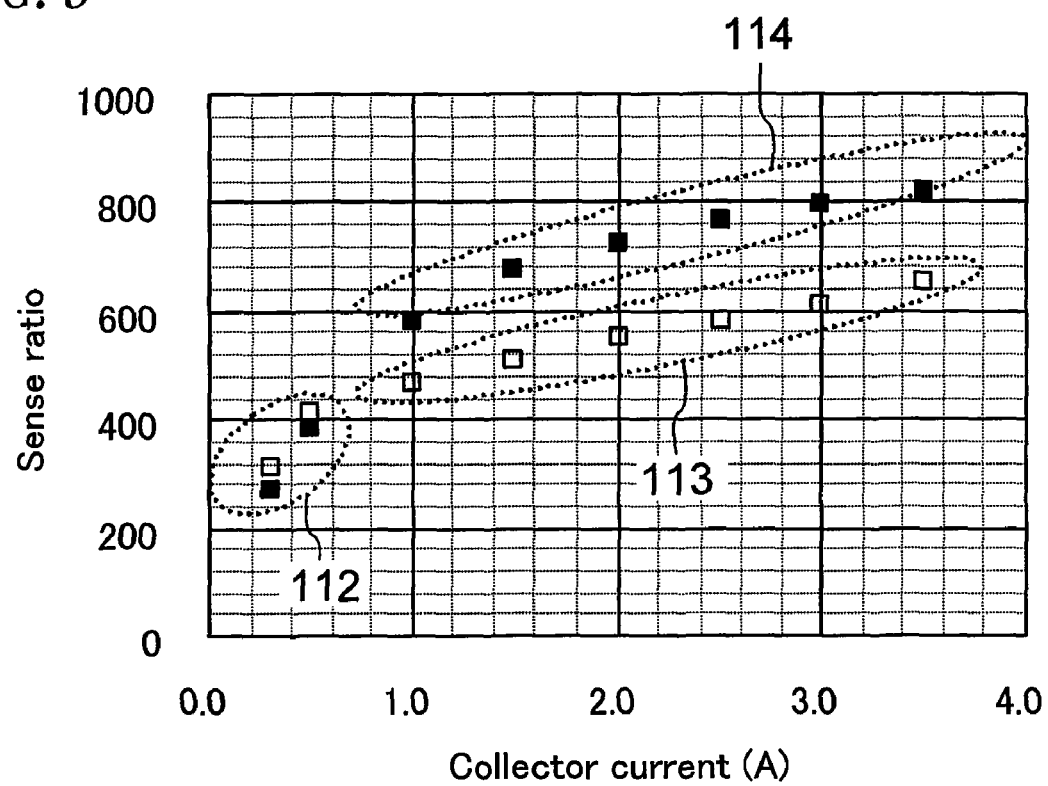
FIG. 9 shows, for comparison purposes, sense ratio variations with respect to collector currents flowing through high-voltage semiconductor switching elements in the semiconductor devices according to the second and third embodiments of the invention.

FIG. 9 shows the relation between collector current flowing through high-voltage semiconductor switching element and sense ratio, obtained by the present inventors from their experiment. In FIG. 9, the open squares indicate the result obtained for the high-voltage semiconductor switching element of this embodiment, and the solid squares represent the result obtained for a high-voltage semiconductor switching element according to a third embodiment which will be described later. As shown in FIG. 9, the sense ratio has values of approximately 300 in a MISFET operation region 112 in which collector voltage (voltage applied to the collector/drain electrode) is low and the collector current is small, whereas in an IGBT operation region 113, the sense ratio has values of are approximately 600 and the variations from the sense ratio in the MISFET operation region 112 are smaller as compared to an IGBT operation region 114 of the third embodiment which will be described later. This means that variations in the collector current 12 with respect to variations in the sense current 13 are small, and therefore, a control circuit that deals with sense ratio variations can be configured easily. Consequently, when overcurrent protection is performed based on the sense current 13, that is, the current passing through the second emitter/source region 110, the collector current 12, that is, the current passing through the high-voltage semiconductor switching element 100, is controlled more precisely.

In this embodiment, the N-type extended drain region (the drift region) 102 is formed, and the P-type collector region 108 and the N-type drain region 109 are formed in the N-type extended drain region 102. Instead of this formation, a P-type collector region and an N-type drain region may be formed in an N-type semiconductor substrate without forming the extended drain region 102. However, in the case in which the N-type extended drain region 102 is formed, a dopant concentration can be increased and hence current capability in the high-voltage semiconductor switching element can be enhanced as compared with cases in which an N-type semiconductor substrate is used. Specifically, since the lifetime of minority carriers in the extended drain region 102, i.e., in the drift region, can be shortened by increasing the dopant concentration in the drift region, the fall time of the collector current (i.e., the time required for the collector current to be off when the gate is off) can be reduced. In addition, the ON resistance during the MISFET operation can be reduced by increasing the dopant concentration in the drift region, thereby permitting a greater collector current to flow during the MISFET operation as compared with cases in which an N-type semiconductor substrate is used.

Also, in this embodiment, a gate insulating film 106 is formed on the base region 103 so as to extend on part of the first emitter/source region 104 and on a part of the extended drain region 102. However, it would be sufficient if the gate insulating film 106 is formed at least on a part of the base region 103 located closer to the collector region 108 with respect to the first emitter/source region 104.

Third Embodiment

A semiconductor device, specifically, a semiconductor device having a high-voltage semiconductor switching element and an overcurrent protection function for the element, according to a third embodiment of the invention will be described with reference to the accompanying drawings. The rough circuit configuration of the semiconductor device of this embodiment is the same as that of the first embodiment shown in FIG. 1, and duplicated descriptions will be thus omitted herein. However, in this embodiment, the first emitter region 104 should be read as a first emitter/source region 104, the second emitter region 110 as a second emitter/source region 110, the collector terminal P1 as a collector/drain terminal (a collector/drain electrode) P1, and the emitter terminal P3 as an emitter/source terminal (an emitter/source electrode) P3.

Figure 10:
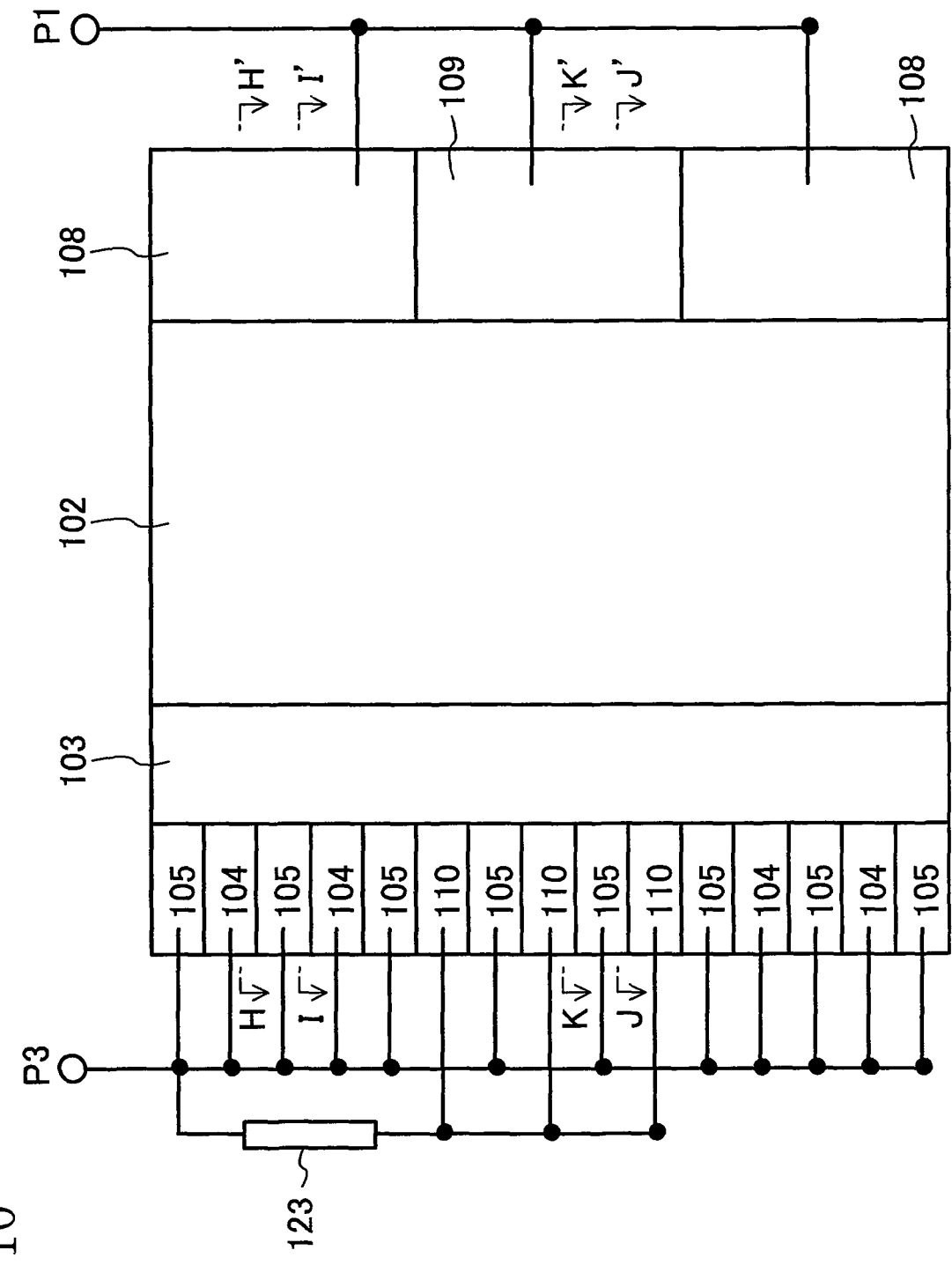
FIG. 10 is a plan view illustrating the configuration of the semiconductor device according to the third embodiment of the invention.
Figure 11:
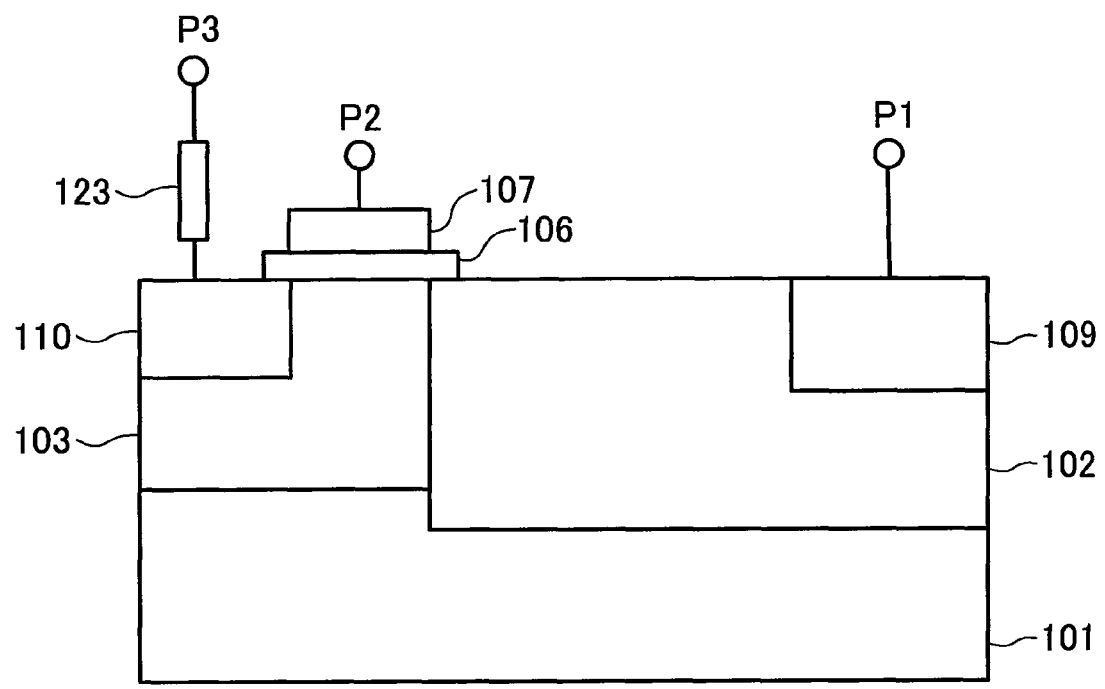
FIG. 11 is a cross-sectional view taken along the line K-K' in FIG. 10.

FIG. 10 is a plan view of the high-voltage semiconductor switching element 100 in the semiconductor device 150 of FIG. 1 according to this embodiment, and FIG. 11 is a cross-sectional view taken along the line K-K' in FIG. 10. A cross-sectional view taken along the line H-H' in FIG. 10 is the same as the cross sectional view in the first embodiment shown in FIG. 3, a cross-sectional view taken along the line I-I' in FIG. 10 is the same as the cross sectional view in the first embodiment shown in FIG. 4, and a cross-sectional view taken along the line J-J' in FIG. 10 is the same as the cross sectional view in the second embodiment shown in FIG. 8. The semiconductor device 150 of this embodiment has the same configuration as the semiconductor devices of the first and second embodiments except for the configuration of the high-voltage semiconductor switching element 100. Thus, in FIGS. 10 and 11, the same members as those in the first embodiment shown in FIGS. 2 to 5 or as those in the second embodiment shown in FIGS. 6 to 8 are identified by the same reference numerals, and duplicated descriptions will be omitted herein.

In this embodiment, the effect obtained in the second embodiment is basically achievable. To be specific, in the semiconductor device 150 having the overcurrent protection function for the high-voltage semiconductor switching element 100 according to this embodiment, when the high-voltage semiconductor switching element 100 performs an IGBT operation, the ratio between a current I3 flowing from second emitter/source region 110 to a sense resistor 123 and a current I2 flowing through the high-voltage semiconductor switching element 100, that is, a sense ratio, can be made twice as much or higher than that obtained when the high-voltage semiconductor switching element 100 performs a MISFET operation or that obtained in the conventional semiconductor device. As a result, the resistance value of the sense resistor 123 and the size of the second emitter/source region 110 can be designed to be larger, so that variations in the current value at which the overcurrent protection operates can be reduced. It is also possible to reduce the length, i.e., the cell pitch, of each part of the collector region 108 which is necessary for the high-voltage semiconductor switching element 100 to switch from the MISFET operation to the IGBT operation.

Furthermore, in this embodiment as in the second embodiment, by changing the location of the second emitter/source region 110 in the high-voltage semiconductor switching element 100 in accordance with the locations of the drain region 109 and of the collector region 108, the ratio between the current I3 that flows from the second emitter/source region 110 to the detection resistor 123 and the current I2 that flows through the high-voltage semiconductor switching element 100 when the high-voltage semiconductor switching element 100 performs the IGBT operation can be changed at will without changing the size of the second emitter/source region 110.

Specifically, in this embodiment, as shown in FIG. 10, the $N^+$-type second emitter/source region 110 faces the $N^+$-type drain region 109 with a P-type base region 103 and an N-type extended drain region 102 interposed therebetween. In this case, the current (the sense current I3) flowing through the second emitter/source region 110 is decreased as compared with a case in which the second emitter/source region 110 faces the $P^+$-type collector region 108 with the base region 103 and the extended drain region 102 interposed therebetween. It is thus possible to increase the sense ratio obtained when the high-voltage semiconductor switching element 100 performs the IGBT operation.

FIG. 9 shows the relation between the collector currents flowing through the high-voltage semiconductor switching element and the sense ratio, obtained by the present inventors from their experiment. In FIG. 9, the open squares indicate the result obtained for the high-voltage semiconductor switching element of the second embodiment set forth above, and the solid squares represent the result obtained for the high-voltage semiconductor switching element of this embodiment. As shown in FIG. 9, in the IGBT operation region 114 of this embodiment, the sense ratio has values of approximately 800 and is thus increased as compared to the IGBT operation region 113 of the above-described second embodiment. That is, the sense ratio is increased further, and therefore, in the semiconductor device 150 having the overcurrent protection function for the high-voltage semiconductor switching element 100 according to this embodiment, the resistance value of the sense resistor 123 and the size of the second emitter/source region 110 (i.e., the current detection IGBT) can be designed to be larger, so that variations in the current value at which the overcurrent protection operates can be reduced further.

In this embodiment, the N-type extended drain region (the drift region) 102 is formed, and the P-type collector region 108 and the N-type drain region 109 are formed in the N-type extended drain region 102. Instead of this formation, a P-type collector region and an N-type drain region may be formed in an N-type semiconductor substrate without forming the extended drain region 102. However, in the case in which the N-type extended drain region 102 is formed, a dopant concentration can be increased and hence current capability in the high-voltage semiconductor switching element can be enhanced as compared with cases in which an N-type semiconductor substrate is used. Specifically, since the lifetime of minority carriers in the extended drain region 102, i.e., in the drift region, can be shortened by increasing the dopant concentration in the drift region, the fall time of the collector current (i.e., the time required for the collector current to be off when the gate is off) can be reduced. In addition, the ON resistance during the MISFET operation can be reduced by increasing the dopant concentration in the drift region, thereby permitting a greater collector current to flow during the MISFET operation as compared with cases in which an N-type semiconductor substrate is used.

Also, in this embodiment, a gate insulating film 106 is formed on the base region 103 so as to extend on part of the first emitter/source region 104 and on a part of the extended drain region 102. However, it would be sufficient if the gate insulating film 106 is formed at least on a part of the base region 103 located closer to the collector region 108 with respect to the first emitter/source region 104.

What is claimed is:

1. A semiconductor device comprising:
   a high-voltage semiconductor switching element controlled by a gate voltage applied to a gate electrode; and
   a current detection unit including a detection resistor for detecting part of current flowing through the high-voltage semiconductor switching element, wherein:
   the high-voltage semiconductor switching element includes:
      a base region of a second conductivity type formed in a semiconductor substrate of a first conductivity type;
      a first emitter/source region of the first conductivity type formed in the base region;
      a first base contact region of the second conductivity type formed in the base region, and adjacent to the first emitter/source region;
      a collector region of the second conductivity type formed in the semiconductor substrate so as to be spaced apart from the base region;
      a drain region of the first conductivity type formed in the semiconductor substrate so as to be spaced apart from the base region;
      a gate insulating film formed at least on a part of the base region located closer to the collector region with respect to the first emitter/source region;
      a gate electrode formed on the gate insulating film;
      a collector/drain electrode formed above the semiconductor substrate and electrically connected with the collector region and the drain region; and
      an emitter/source electrode formed above the semiconductor substrate and electrically connected with the first base contact region and the first emitter/source region,
   a second emitter/source region of the first conductivity type spaced apart from the first emitter/source region, and a second base contact region of the second conductivity type adjacent to the second emitter/source region are formed in the base region,
   the second emitter/source region is electrically connected to the first emitter/source region through the detection resistor, and
   the second base contact region is directly connected to the emitter source electrode.

2. The semiconductor device of claim 1, wherein the collector region and the drain region each include a plurality of separate parts; and
   each part of the collector region and each part of the drain region are located alternately so as to be in contact with each other in a direction perpendicular to a direction going from the collector region to the first emitter/source region.

3. The semiconductor device of claim 2, wherein the second emitter/source region and the collector region are located so as to face each other with a part of the base region interposed therebetween.

4. The semiconductor device of claim 2, wherein the second emitter/source region and the drain region are located so as to face each other with a part of the base region interposed therebetween.

5. A semiconductor device comprising:
   a high-voltage semiconductor switching element controlled by a gate voltage applied to a gate electrode; and
   a current detection unit including a detection resistor for detecting part of current flowing through the high-voltage semiconductor switching element, wherein:
   the high-voltage semiconductor switching element includes:
      a base region of a second conductivity type formed in a semiconductor substrate of a second conductivity type;
      a first emitter/source region of the first conductivity type formed in the base region;
      a first base contact region of the second conductivity type formed in the base region, and adjacent to the first emitter/source region;
      a collector region of the second conductivity type formed in the semiconductor substrate so as to be spaced apart from the base region;
      a drain region of the first conductivity type formed in the semiconductor substrate so as to be spaced apart from the base region;
      a gate insulating film formed at least on a part of the base region located closer to the collector region with respect to the first emitter/source region;
      a gate electrode formed on the gate insulating film;
      a collector/drain electrode formed above the semiconductor substrate and electrically connected with the collector region and the drain region; and
      an emitter/source electrode formed above the semiconductor substrate and electrically connected with the first base contact region and the first emitter/source region,
   a second emitter/source region of the first conductivity type spaced apart from the first emitter/source region, and a second base contact region of the second conductivity type adjacent to the second emitter/source region are formed in the base region,
   the second emitter/source electrode is electrically connected to the first emitter/source region through the detection resistor,
   the second base contact region is directly connected to the emitter source electrode,
   the semiconductor device further includes a drift region of the first conductivity type formed in the semiconductor substrate so as to be adjacent to the base region,
   the first emitter/source region and the second emitter/source region are spaced apart from the drift region, and
   the collector region and the drain region are formed in the drift region.

6. The semiconductor device of claim 5, wherein the collector region and the drain region each include a plurality of separate parts, and
   each part of the collector region and each part of the drain region are located alternately so as to be in contact with each other in a direction perpendicular to a direction going from the collector region to the first emitter/source region.

7. The semiconductor device of claim 6, wherein the second emitter/source region and the collector region are located so as to face each other with a part of the base region interposed therebetween.

8. The semiconductor device of claim 6, wherein the second emitter/source region and the drain region are located so as to face each other with a part of the base region interposed therebetween.

9. A semiconductor device comprising:
a high-voltage semiconductor switching element controlled by a gate voltage applied to a gate electrode; and
a current detection unit including a detection resistor for detecting part of current flowing through the high-voltage semiconductor switching element, wherein:
the high-voltage semiconductor switching element includes:
a base region of a second conductivity type formed in a semiconductor substrate of a first conductivity type;
a first emitter/source region of the first conductivity type formed in the base region;
a first base contact region of the second conductivity type formed in the base region, and adjacent to the first emitter/source region;
a collector region of the second conductivity type formed in the semiconductor substrate so as to be spaced apart from the base region;
a drain region of the first conductivity type formed in the semiconductor substrate so as to be spaced apart from the base region;
a gate insulating film formed at least on a part of the base region located closer to the collector region with respect to the first emitter/source region;
a gate electrode formed on the gate insulating film;
a collector/drain electrode formed above the semiconductor substrate and electrically connected with the collector region and the drain region; and
an emitter/source electrode formed above the semiconductor substrate and electrically connected with the first base contact region and the first emitter/source region,
a second emitter/source region of the first conductivity type spaced apart from the first emitter/source region, and a second base contact region of the second conductivity type adjacent to the second emitter/source region are formed in the base region,
the second emitter/source region is electrically connected to the first emitter/source region through the detection resistor, and
the second base contact region is connected to the emitter/source electrode without the detection resistor.

10. The semiconductor device of claim 9, wherein the collector region and the drain region each include a plurality of separate parts; and
each part of the collector region and each part of the drain region are located alternately so as to be in contact with each other in a direction perpendicular to a direction going from the collector region to the first emitter/source region.

11. The semiconductor device of claim 10, wherein the second emitter/source region and the collector region are located so as to face each other with a part of the base region interposed therebetween.

12. The semiconductor device of claim 10, wherein the second emitter/source region and the drain region are located so as to face each other with a part of the base region interposed therebetween.

13. A semiconductor device comprising:
a high-voltage semiconductor switching element controlled by a gate voltage applied to a gate electrode; and
a current detection unit including a detection resistor for detecting part of current flowing through the high-voltage semiconductor switching element, wherein:
the high-voltage semiconductor switching element includes:
a base region of a second conductivity type formed in a semiconductor substrate of a second conductivity type;
a first emitter/source region of the first conductivity type formed in the base region;
a first base contact region of the second conductivity type formed in the base region, and adjacent to the first emitter/source region;
a collector region of the second conductivity type formed in the semiconductor substrate so as to be spaced apart from the base region;
a drain region of the first conductivity type formed in the semiconductor substrate so as to be spaced apart from the base region;
a gate insulating film formed at least on a part of the base region located closer to the collector region with respect to the first emitter/source region;
a gate electrode formed on the gate insulating film;
a collector/drain electrode formed above the semiconductor substrate and electrically connected with the collector region and the drain region; and
an emitter/source electrode formed above the semiconductor substrate and electrically connected with the first base contact region and the first emitter/source region,
a second emitter/source region of the first conductivity type spaced apart from the first emitter/source region, and a second base contact region of the second conductivity type adjacent to the second emitter/source region are formed in the base region,
the second emitter/source region is electrically connected to the first emitter/source region through the detection resistor,
the second base contact region is connected to the emitter/source electrode without the detection resistor,
the semiconductor device further includes a drift region of the first conductivity type formed in the semiconductor substrate so as to be adjacent to the base region,
the first emitter/source region and the second emitter/source region are spaced apart from the drift region, and
the collector region and the drain region are formed in the drift region.

14. The semiconductor device of claim 13, wherein the collector region and the drain region each include a plurality of separate parts; and
each part of the collector region and each part of the drain region are located alternately so as to be in contact with each other in a direction perpendicular to a direction going from the collector region to the first emitter/source region.

15. The semiconductor device of claim 14, wherein the second emitter/source region and the collector region are located so as to face each other with a part of the base region interposed therebetween.

16. The semiconductor device of claim 14, wherein the second emitter/source region and the drain region are located so as to face each other with a part of the base region interposed therebetween.

* * * * *